United States Patent
Kim

(10) Patent No.: US 11,705,170 B2
(45) Date of Patent: Jul. 18, 2023

(54) MEMORY DEVICE RELATED TO PERFORMING A COLUMN OPERATION

(71) Applicant: SK hynix Inc., Icheon-si (KR)

(72) Inventor: Woongrae Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 37 days.

(21) Appl. No.: 17/524,307

(22) Filed: Nov. 11, 2021

(65) Prior Publication Data

US 2023/0037073 A1 Feb. 2, 2023

(30) Foreign Application Priority Data

Jul. 27, 2021 (KR) .................. 10-2021-0098653

(51) Int. Cl.
*G11C 7/10* (2006.01)
*G11C 7/22* (2006.01)

(52) U.S. Cl.
CPC .............. *G11C 7/1096* (2013.01); *G11C 7/222* (2013.01); *G11C 7/1009* (2013.01); *G11C 7/1012* (2013.01); *G11C 7/1069* (2013.01); *G11C 7/1087* (2013.01)

(58) Field of Classification Search
CPC .... G11C 7/1096; G11C 7/1009; G11C 7/1012; G11C 7/1069; G11C 7/1087; G11C 7/222

USPC ................................................ 365/189.05
See application file for complete search history.

(56) References Cited

U.S. PATENT DOCUMENTS

| 10,503,435 | B2 | 12/2019 | Bains et al. | |
|---|---|---|---|---|
| 2009/0235014 | A1* | 9/2009 | Yim et al. | G06F 12/0871 711/E12.008 |
| 2010/0177590 | A1* | 7/2010 | Lee | G11C 7/1027 365/233.18 |

FOREIGN PATENT DOCUMENTS

KR 101735091 B1 5/2017

* cited by examiner

*Primary Examiner* — Huan Hoang
(74) *Attorney, Agent, or Firm* — William Park & Associates Ltd.

(57) ABSTRACT

A memory device includes an external information input circuit configured to generate a burst mode signal and a write command pulse for a write operation, by receiving external information for the write operation; and a write operation control circuit configured to generate a write control pulse for storing internal data in a cell array, from the write command pulse when a first burst mode is performed on the basis of the burst mode signal, and to control whether to generate the write control pulse from the write command pulse when a second burst mode is performed on the basis of the burst mode signal.

20 Claims, 16 Drawing Sheets

FIG. 3

| OPERATION | CS | CA<1> | CA<2> | CA<3> | CA<4> | CA<5> | CA<6> |
|---|---|---|---|---|---|---|---|
| WRITE (FIRST BURST MODE) | H | H | L | H | H | L | BL 'H' |
| | L | ADD<1> | ADD<2> | ADD<3> | ADD<4> | ADD<5> | ADD<6> 'A' |
| WRITE (SECOND BURST MODE) | H | H | L | H | H | L | BL 'L' |
| | L | ADD<1> | ADD<2> | ADD<3> | ADD<4> | ADD<5> | ADD<6> 'A' |
| READ (FIRST BURST MODE) | H | H | L | H | H | H | BL 'H' |
| | L | ADD<1> | ADD<2> | ADD<3> | ADD<4> | ADD<5> | ADD<6> 'B' |
| READ (SECOND BURST MODE) | H | H | L | H | H | H | BL 'L' |
| | L | ADD<1> | ADD<2> | ADD<3> | ADD<4> | ADD<5> | ADD<6> 'B' |

US 11,705,170 B2

1

MEMORY DEVICE RELATED TO PERFORMING A COLUMN OPERATION

CROSS-REFERENCE TO RELATED APPLICATION

The present application claims priority under 35 U.S.C. § 119(a) to Korean application number 10-2021-0098653, filed in the Korean Intellectual Property Office on Jul. 27, 2021, the entire disclosure of which is incorporated herein by reference in its entirety.

BACKGROUND

1. Technical Field

The present disclosure generally relates to a memory device, and more particularly, to a memory device related to performing a column operation.

2. Related Art

A memory device may perform a column operation including a write operation of receiving data from a controller and storing the received data in memory cells and a read operation of outputting data stored in memory cells to the controller. An amount of data to be transmitted may be determined by a width of a line through which the data is transmitted and a burst length of the data to be transmitted. When performing the column operation, the memory device and the controller may adjust an amount of data to be transmitted, by varying a burst length of the data.

SUMMARY

In an embodiment, a memory device may include: an external information input circuit configured to generate a burst mode signal and a write command pulse for a write operation, by receiving external information for the write operation; and a write operation control circuit configured to generate a write control pulse, for storing internal data in a cell array, from the write command pulse when a first burst mode is performed on the basis of the burst mode signal, and to control whether to generate the write control pulse from the write command pulse when a second burst mode is performed on the basis of the burst mode signal.

In an embodiment, a memory device may include: an external information input circuit configured to generate a burst mode signal and a read command pulse for a read operation, by receiving external information for the read operation; and a read operation control circuit configured to generate a read control pulse, for outputting internal data stored in a cell array, from the read command pulse when a first burst mode is performed on the basis of the burst mode signal, and to control whether to generate the read control pulse from the read command pulse when a second burst mode is performed on the basis of the burst mode signal.

BRIEF DESCRIPTION OF THE DRAWINGS

FIG. 3 is a table for explaining the operation of an external information input circuit illustrated in FIG. 2.

2

Figure 2:
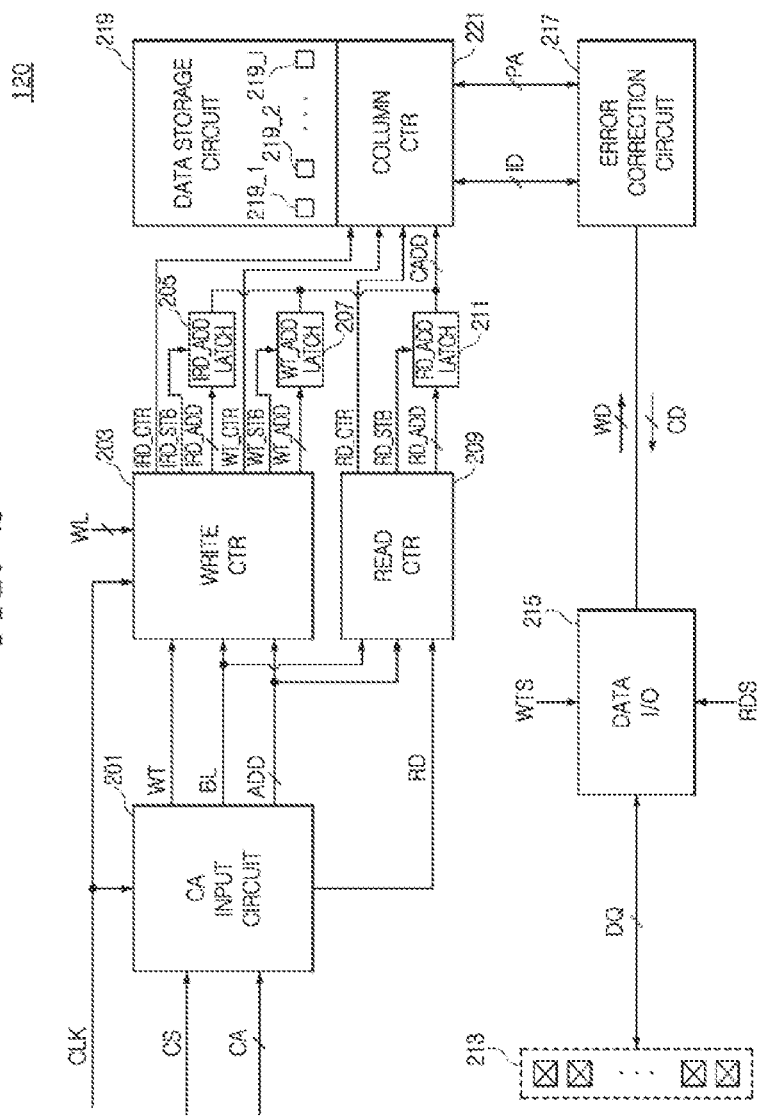
FIG. 2 is a block diagram illustrating a configuration of an example of a memory device illustrated in FIG. 1.
Figure 4:
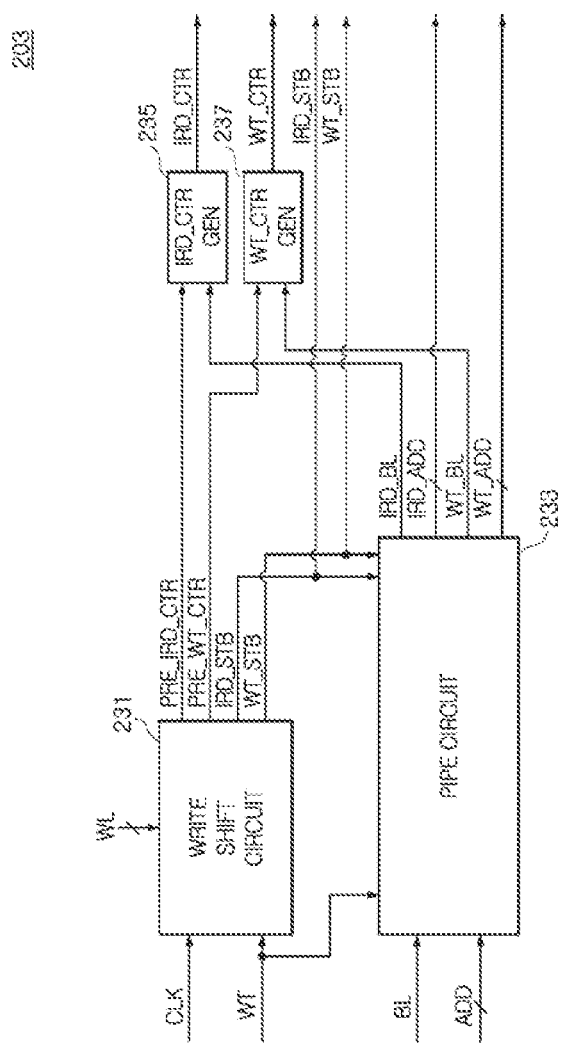

FIG. 4 is a block diagram illustrating a configuration of an example of a write operation control circuit illustrated in FIG. 2.

Figure 5:
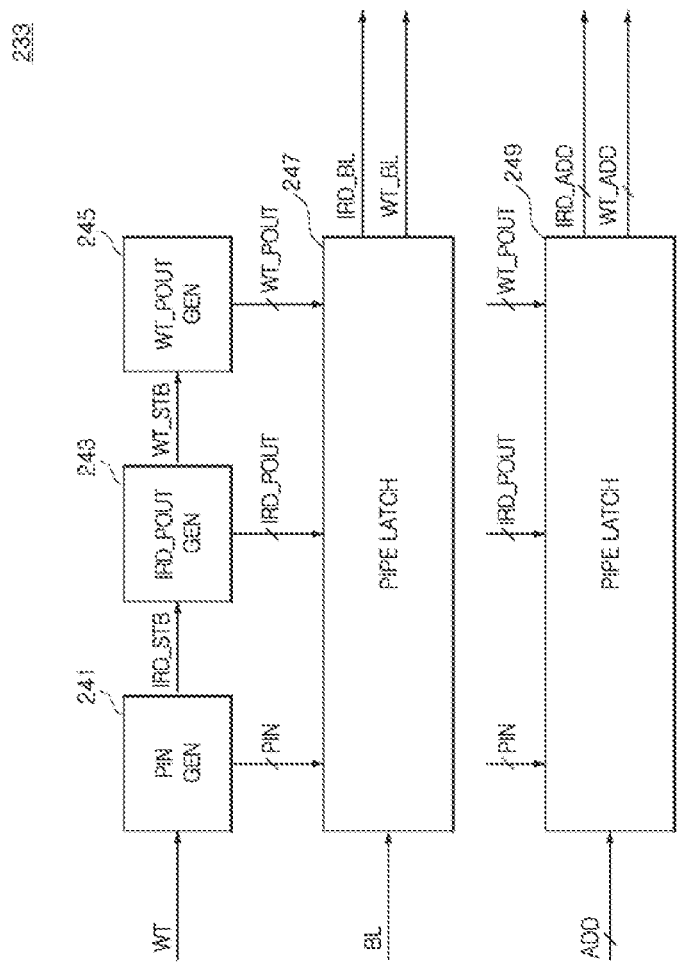

FIG. 5 is a block diagram illustrating a configuration of an example of a pipe circuit illustrated in FIG. 4.

Figure 6:
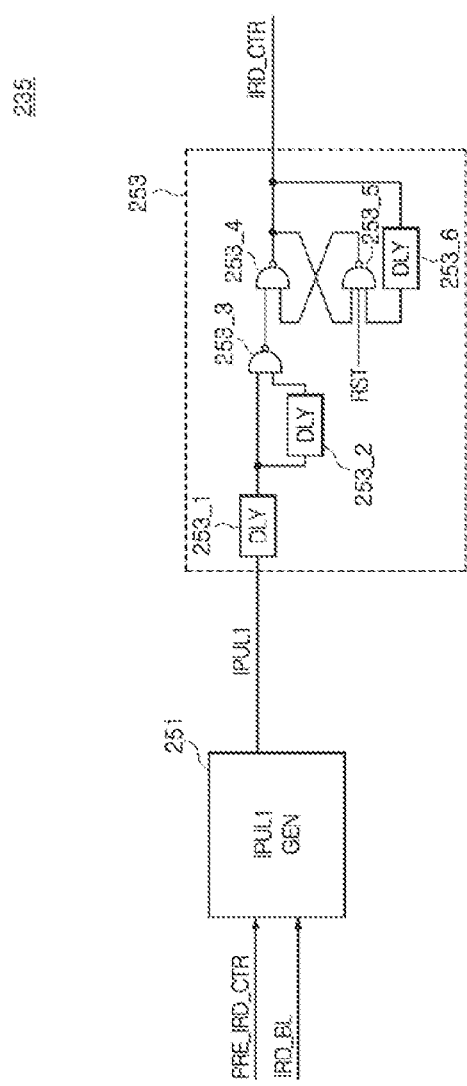

FIG. 6 is a diagram illustrating an example of an internal read control pulse generation circuit illustrated in FIG. 4.

Figure 7:
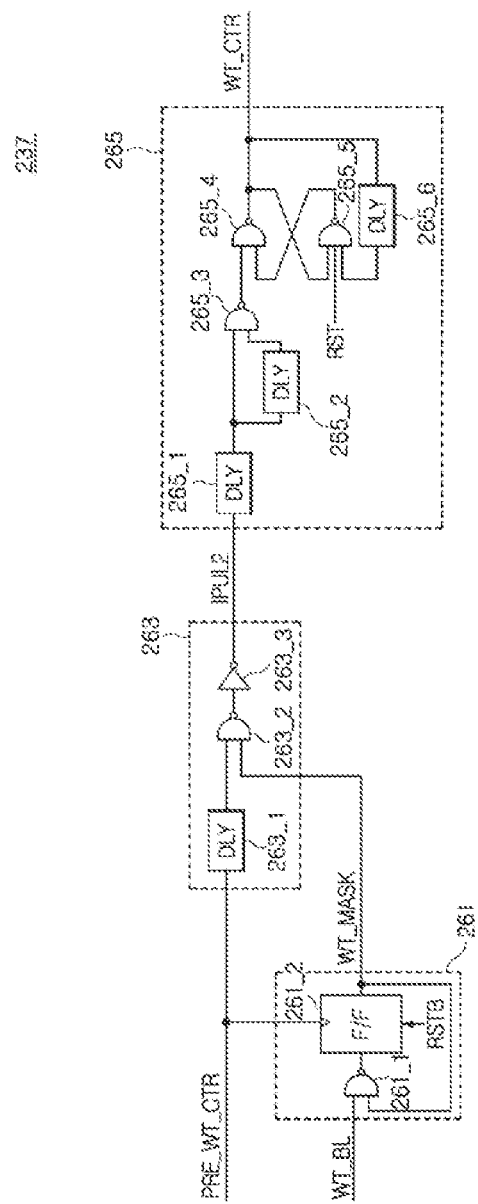

FIG. 7 is a circuit diagram illustrating an example of a write control pulse generation circuit illustrated in FIG. 4.

Figure 8:
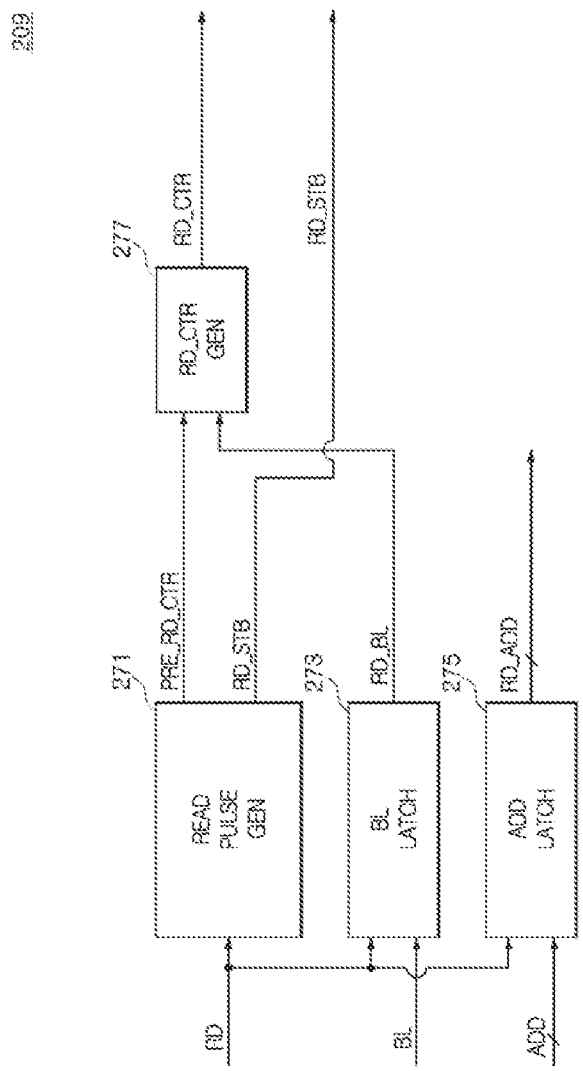

FIG. 8 is a block diagram illustrating a configuration of an example of a read operation control circuit illustrated in FIG. 2.

Figure 9:
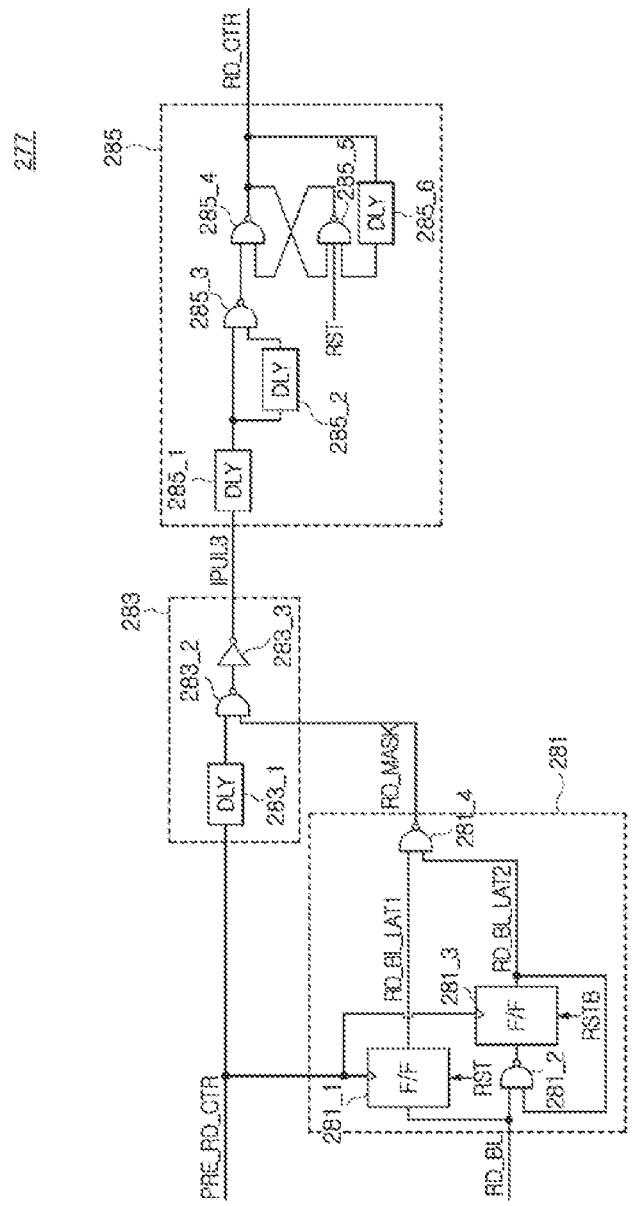

FIG. 9 is a circuit diagram illustrating an example of a read control pulse generation circuit illustrated in FIG. 8.

Figure 10:
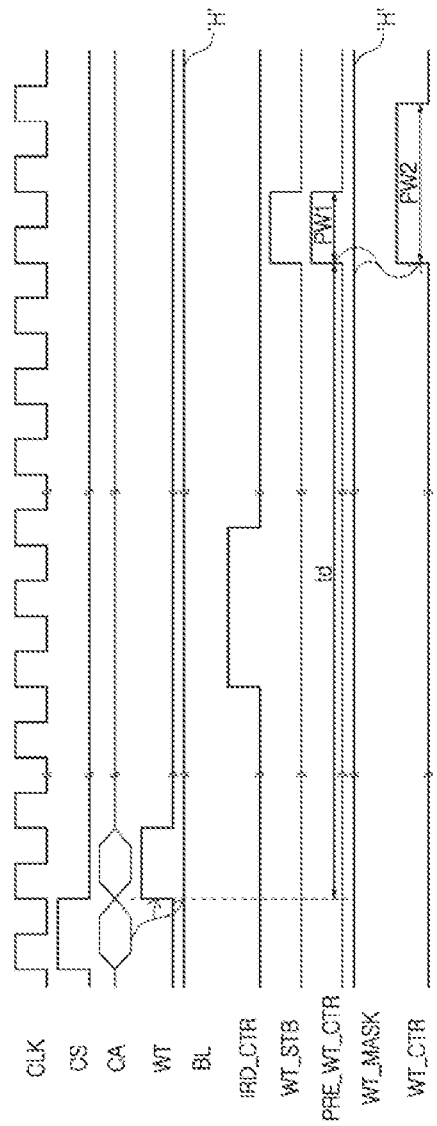
Figure 11:
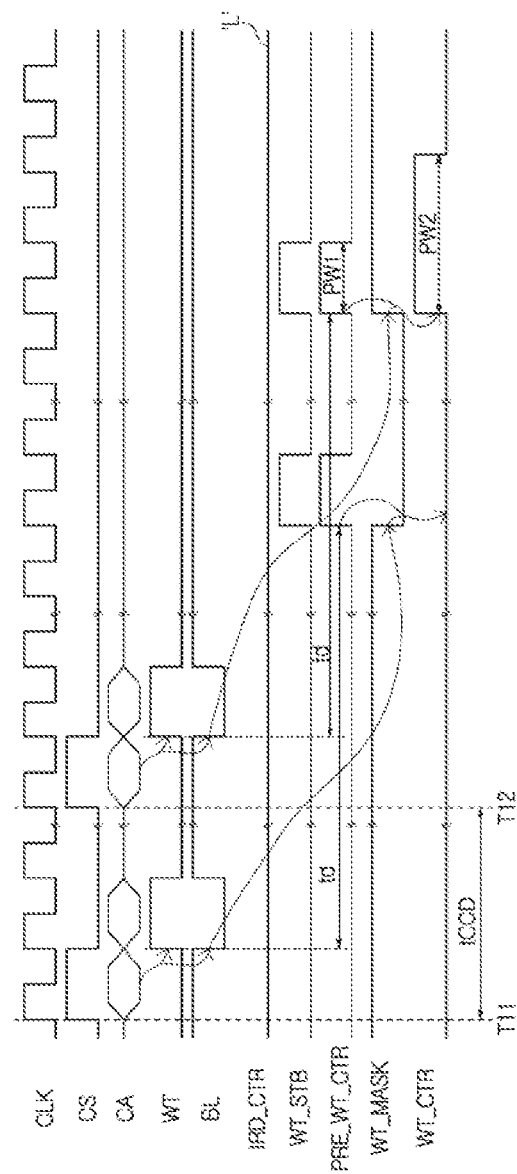

FIGS. 10 and 11 are timing diagrams for explaining a write operation performed in the memory device illustrated in FIG. 2.

Figure 12:
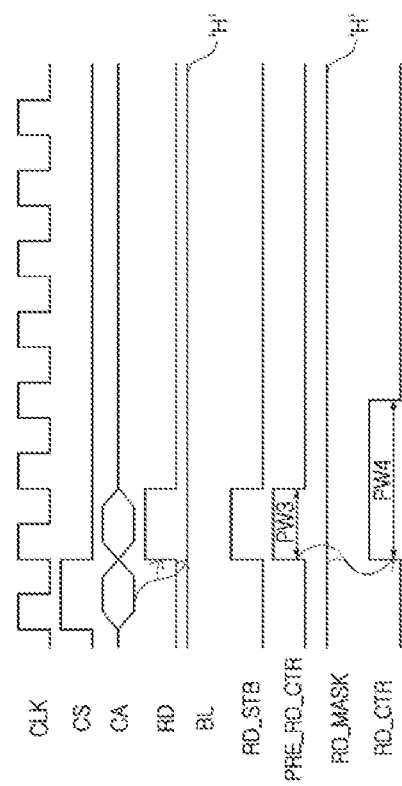
Figure 13:
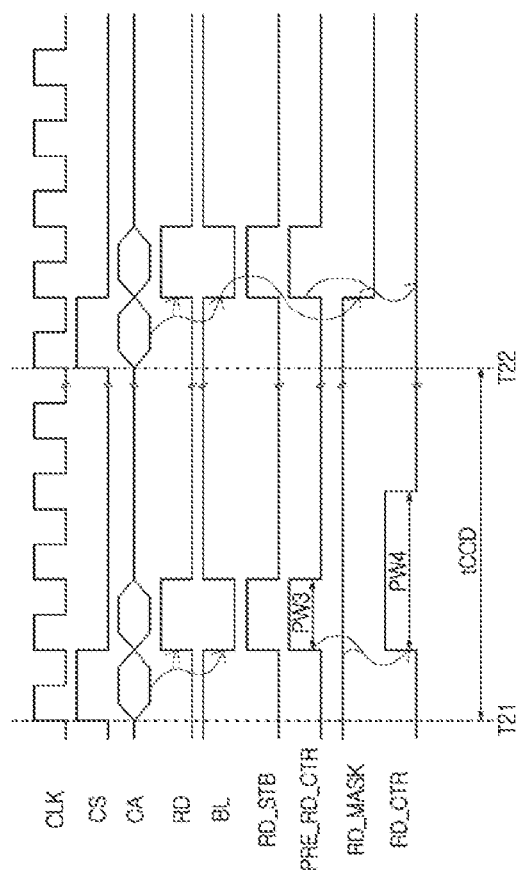

FIGS. 12 and 13 are timing diagrams for explaining a read operation performed in the memory device illustrated in FIG. 2.

Figure 14:
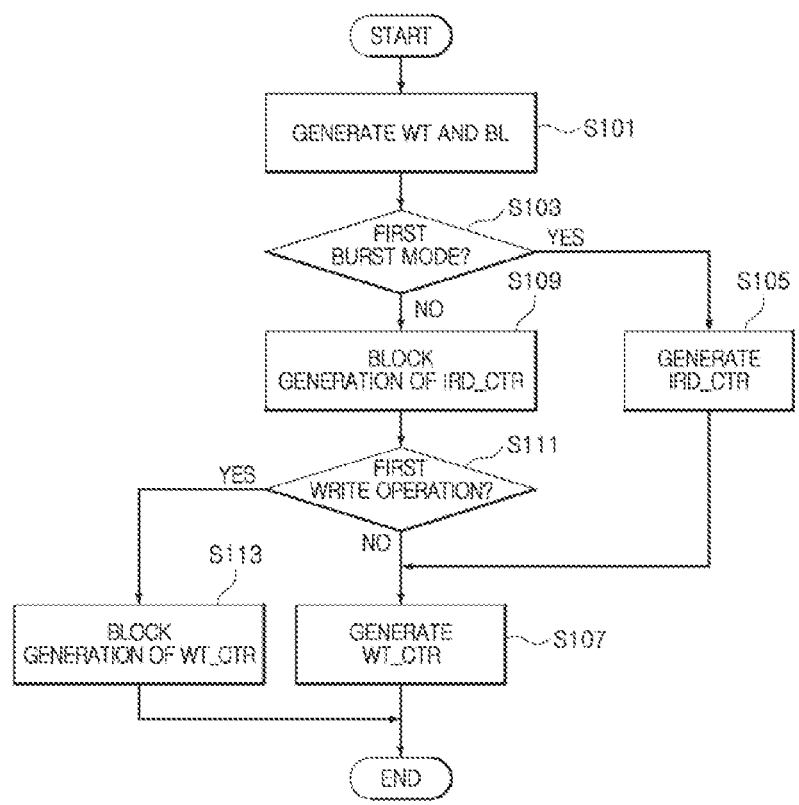
Figure 15:
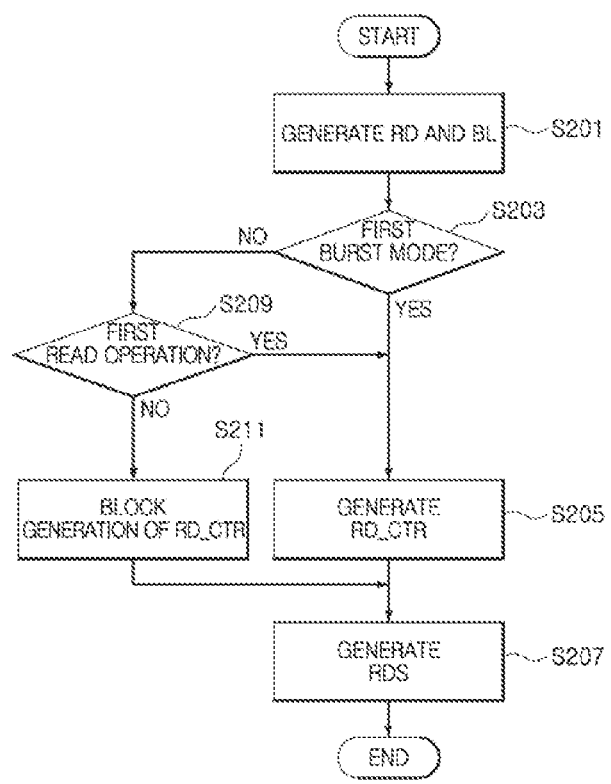

FIGS. 14 and 15 are flowcharts for explaining the write operation and the read operation, respectively, performed in the memory device illustrated in FIG. 2.

Figure 1:
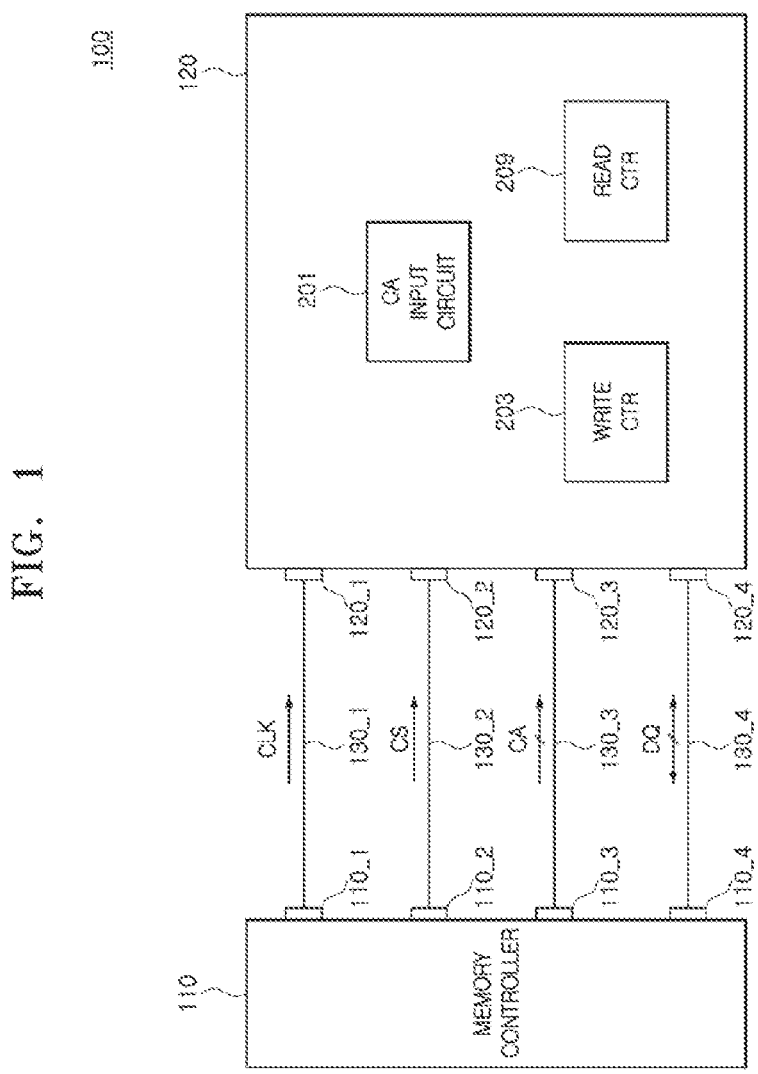
FIG. 1 is a block diagram illustrating a configuration of an electronic system in accordance with an embodiment of the present disclosure.
Figure 16:
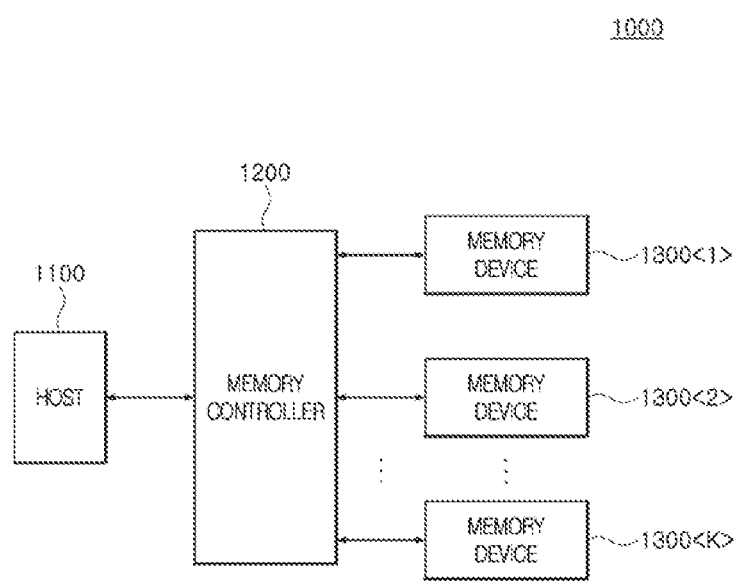

FIG. 16 is a block diagram illustrating a configuration of another example of the electronic system illustrated in FIG. 1.

DETAILED DESCRIPTION

In the following descriptions of examples, the term "preset" indicates that the numerical value of a parameter is previously decided, when the parameter is used in a process or algorithm. According to an example, the numerical value of the parameter may be set when the process or algorithm is started or during a period in which the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through still another component interposed therebetween. On the other hand, when one component is referred to as being "directly coupled" or "directly connected" to another component, it should be understood that the components are directly coupled or connected to each other without still another component interposed therebetween.

"Logic high level" and "logic low level" are used to describe the logic levels of signals. A signal having "logic high level" is distinguished from a signal having "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the teachings of the present disclosure will be described through various examples. These examples are only used to exemplify the teachings of the present disclosure, and the scope of the present disclosure is not limited by these examples.

Some examples of the present disclosure are directed to a memory device performing a column operation.

According to an embodiment, by performing a burst mode involving successive column operations, it may be possible to quickly perform an internal calculation when a size of data transmitted and received to and from the outside in one column operation is smaller than a size of data required for the internal calculation.

Also, according to an embodiment, when performing a burst mode involving successive write operations, the successive write operations may be stably performed by blocking, in a preceding write operation, the generation of a write control pulse for storing internal data in cell arrays and generating the write control pulse in a subsequent write operation, Further, according to an embodiment, when performing a burst mode involving successive read operations, the successive read operations may be stably performed by generating, in a preceding read operation, a read control pulse for outputting internal data stored in cell arrays and blocking the generation of the read control pulse in a subsequent read operation.

FIG. 1 is a block diagram illustrating a configuration of an electronic system 100 in accordance with an example of the present disclosure. As illustrated in FIG. 1, the electronic system 100 may include a memory controller 110 and a memory device 120. The memory controller 110 may include a first control pin 110_1, a second control pin 110_2, a third control pin 110_3 and a fourth control pin 110_4. The memory device 120 may include a first device pin 120_1, a second device pin 120_2, a third device pin 120_3 and a fourth device pin 120_4.

The memory controller 110 may transmit a clock CLK to the memory device 120 through a first transmission line 130_1 which is coupled between the first control pin 110_1 and the first device pin 120_1.

The memory controller 110 may transmit an external signal CS to tile memory device 120 through a second transmission line 130_2 which is coupled between the second control pin 110_2 and the second device pin 120_2.

The memory controller 110 may transmit external information CA to the memory device 120 through a third transmission line 130_3 which is coupled between the third control pin 110_3 and the third device pin 120_3. The external information CA may include information on commands for a write operation and a read operation, information on a burst mode and information on an address. The burst mode may include a first burst mode and a second burst mode. The first burst mode may be set as a mode for transmitting and receiving data DQ having a first burst length L (L is a natural number of 2 or greater) to and from the memory device 120. The second burst mode may be set as a mode for transmitting and receiving data DQ having a second burst length 2L to and from the memory device 120. The second burst length 2L may be set to two times the first burst length L. For example, the first burst length L and the second burst length 2L may be set to 16 and 32, respectively. In an embodiment, the burst length may be the amount of data transferred between two elements in each transmission. For example, the first burst length L may have 16 numbers of sequential data transferred between two elements in a transmission and the second burst length 2L may have 32 numbers of sequential data transferred between two elements in a transmission. The memory controller 110 may transmit, to the memory device 120, the external information CA including information on the first burst mode together with information on a command and an address. The memory controller 110 may successively transmit with a preset interval, to the memory device 120, the external information CA including information on the second burst mode together with information on a command and an address. A write operation in the second burst mode may include a first write operation and a second write operation that are successively performed with the preset interval. A read operation in the second burst mode may include a first read operation and a second read operation that are successively performed with the preset interval. The preset interval may be variously set depending on an embodiment, The number of bits of the external information CA may be variously set depending on an embodiment, The memory controller 110 may transmit and receive data DQ to and from the memory device 120 through a fourth transmission line 130_4 which is coupled between the fourth control pin 110_4 and the fourth device pin 120_4. The data DQ may include a plurality of data DQ< 1: N> (N is a natural number of 2 or greater).

The memory device 120 may include an external information input circuit (CA INPUT CIRCUIT) 201, a write operation control circuit (WRITE CTR) 203 and a read operation control circuit (READ CTR) 209. The memory device 120 may perform various internal operations including a write operation of receiving data DQ and storing the data DQ in cell arrays 219_1 to 219_I (I is a natural number of 2 or greater) (see FIG. 2), a read operation of outputting data DQ stored in the cell arrays 219_1 to 219_I and a burst mode, on the basis of the clock CLK, the external signal CS and the external information CA.

The memory device 120 may receive the plurality of data DQ<1:N> having the first burst length L, after a write latency elapses from a time point when the external information CA for the write operation in the first burst mode is received. That is to say, when performing the write operation in the first burst mode, the memory device 120 may receive the data DQ having L x N bits. The memory device 120 may receive the plurality of data DQ< 1: N> having one half of the second burst length 2L, after the write latency elapses from a time point when the external information CA for the first write operation in the second burst mode is received. The memory device 120 may receive the plurality of data DQ< 1: N> having the other half of the second burst length 2L, after the write latency elapses from a time point when the external information CA for the second write operation in the second burst mode is received. In the second burst mode, by successively performing the first and second write operations with the preset interval, the memory device 120 may receive the plurality of data DQ<1:N> having the second burst length 2L. In other words, when performing the first and second write operations in the second burst mode, the memory device 120 may receive the data DQ having 2L x N bits.

The memory device 120 may output the plurality of data DQ<1:N> having the first burst length L, after a read latency elapses from a time point when the external information CA for the read operation in the first burst mode is received. That is to say, when performing the read operation in the first burst mode, the memory device 120 may output the data DQ having L x N bits. The memory device 120 may output the plurality of data DQ<1:N > having one half of the second burst length 2L, after the read latency elapses from a time point when the external information CA for the first read operation in the second burst mode is received. The memory device 120 may output the plurality of data DQ<

1:N> having the other half of the second burst length 2L, after the read latency elapses from a time point when the external information CA for the second read operation in the second burst mode is received. In the second burst mode, by successively performing the first and second read operations with the preset interval, the memory device 120 may output the plurality of data DQ< 1:N > having the second burst length 2L. In other words, when performing the first and second read operations in the second burst mode, the memory device 120 may output the data DQ having 2L x N bits.

Accordingly, in an embodiment, by performing a burst mode involving successive column operations to increase the burst length of the data DQ, the memory device 120 may quickly perform an internal calculation when a size of the data DQ transmitted and received to and from the outside in one column operation is smaller than a size of the data DQ required for the internal calculation.

The external information input circuit 201 may receive the external information CA on the basis of the clock CLK and the external signal CS, and thereby, may generate a write command pulse WT (see FIG. 2) for the write operation, a read command pulse RD (see FIG. 2) for the read operation and a burst mode signal BL (see FIG. 2) for setting the burst mode.

The write operation control circuit 203 may generate a write control pulse WT_CTR (see FIG. 2) for storing internal data ID (see FIG. 2) in the cell arrays 219_1 to 219_I (see FIG. 2), on the basis of the write command pulse WT (see FIG. 2) and the burst mode signal BL (see FIG. 2). The write control pulse WT_CTR may have a pulse width wider than the write command pulse WT to store the internal data ID in the cell arrays 219_1 to 219_I. When the first burst mode is performed on the basis of the burst mode signal BL, the write operation control circuit 203 may generate the write control pulse WT_CTR from the write command pulse WT. When the second burst mode is performed on the basis of the burst mode signal BL, the write operation control circuit 203 may control whether to generate the write control pulse WT_CTR from the write command pulse WT. For example, when performing the first write operation in the second burst mode, the write operation control circuit 203 may block the generation of the write control pulse WT_CTR from the write command pulse WT. When performing the second write operation in the second burst mode, the write operation control circuit 203 may generate the write control pulse WT_CTR from the write command pulse WT. Accordingly, in an embodiment, when performing a burst mode involving successive write operations at a preset interval, the memory device 120 may block the generation of the write control pulse WT_CTR, having a wide pulse width, in a preceding write operation, and may generate the write control pulse WT_CTR for storing the internal data ID in the cell arrays 219_1 to 219_I, in a subsequent write operation, whereby it may be possible to stably perform the successive write operations.

The read operation control circuit 209 may generate a read control pulse RD_CTR (see FIG. 2) for outputting internal data ID (see FIG. 2) stored in the cell arrays 219_1 to 219_I (see FIG. 2), on the basis of the read command pulse RD (see FIG. 2) and the burst mode signal BL (see FIG. 2). The read control pulse RD_CTR may have a pulse width wider than the read command pulse RD to output the internal data ID stored in the cell arrays 219_1 to 219_I. When the first burst mode is performed on the basis of the burst mode signal BL, the read operation control circuit 209 may generate the read control pulse RD_CTR from the read command pulse RD. When the second burst mode is performed on the basis of the burst mode signal BL, the read operation control circuit 209 may control whether to generate the read control pulse RD_CTR from the read command pulse RD. For example, when performing the first read operation in the second burst mode, the read operation control circuit 209 may generate the read control pulse RD_CTR from the read command pulse RD. When performing the second read operation in the second burst mode, the read operation control circuit 209 may block the generation of the read control pulse RD_CTR from the read command pulse RD. Accordingly, in an embodiment, when performing a burst mode involving successive read operations at a preset interval, the memory device 120 may generate the read control pulse RD_CTR for outputting the internal data ID stored in the cell arrays 219_1 to 219_I, in a preceding read operation, and may block the generation of the read control pulse RD_CTR, having a wide pulse width, in a subsequent read operation, whereby it may be possible to stably perform the successive read operations.

FIG. 2 is a block diagram illustrating a configuration of an example of the memory device 120. As illustrated in FIG. 2, the memory device 120 may include the external information input circuit (CA INPUT CIRCUIT) 201, the write operation control circuit (WRITE CTR) 203, an internal read address latch circuit (IRD_ADD LATCH) 205, a write address latch circuit (WT_ADD LATCH) 207, the read operation control circuit (READ CTR) 209, a read address latch circuit (RD_ADD LATCH) 211, a pad array 213, a data input/output circuit (DATA I/O) 215, an error correction circuit (ERROR CORRECTION CIRCUIT) 217, a data storage circuit (DATA STORAGE CIRCUIT) 219, and a column operation control circuit (COLUMN CTR) 221.

The external information input circuit 201 may receive the external information CA in synchronization with the clock CLK on the basis of the external signal CS, and thereby, may generate the write command pulse WT for the write operation, the read command pulse RD for the read operation, the burst mode signal BL for setting the burst mode, and an address ADD. The external information CA may include information on commands for the write operation and the read operation, information on the burst mode and information on the address ADD. The burst mode signal BL may be generated to set the burst mode to one of the first and second burst modes. The burst mode signal BL may have a first logic level to set the burst mode to the first burst mode, The burst mode signal BL may have a second logic level to set the burst mode to the second burst mode. The first logic level and the second logic level may be set to a logic high level and a logic low level, respectively. According to an embodiment, the first logic level and the second logic level may be set to a logic low level and a logic high level, respectively.

The external information input circuit 201 may receive the external information CA for the write operation, on the basis of the external signal CS, and thereby, may generate the write command pulse WT for the write operation, the burst mode signal BL for setting the burst mode and the address ADD for the write operation. The external information input circuit 201 may generate the write command pulse WT by decoding the external information CA for the write operation, on the basis of the external signal CS. The external information input circuit 201 may generate the burst mode signal BL by extracting the external information CA for the write operation, on the basis of the external signal CS. The external information input circuit 201 may generate the address ADD from the external information CA for the write operation, on the basis of the external signal CS. At each time of receiving the external information CA for the write operation in the first burst mode, on the basis of the external signal CS, the external information input circuit 201 may generate the write command pulse WT, the burst mode signal BL for the first burst mode and the address ADD. At each time of receiving the external information CA for the write operation in the second burst mode, on the basis of the external signal CS, the external information input circuit 201 may generate the write command pulse WT, the burst mode signal BL for the second burst mode and the address ADD. The external information CA for the write operation in the second burst mode may be successively transmitted to the external information input circuit 201 with the preset interval. Namely, the write operation in the second burst mode may include the first and second write operations that are successively performed with the preset interval. When successively receiving, with the preset interval, the external information CA for the write operation in the second burst mode, the external information input circuit 201 may sequentially generate the write command pulse WT, the burst mode signal BL and the address ADD for the first and second write operations. Combinations of the address ADD for the first and second write operations may be set as corresponding combinations. For example, the combination of the address ADD for the second write operation may be set as a combination in which some bits are different from the combination of the address ADD for the first write operation. For example, when the combination of the address ADD for the first write operation is set to 'L, L, L, L, L, L' corresponding to a first cell array 219_1, the combination of the address ADD for the second write operation may be set to 'L, L, L, L, L, H' corresponding to a second cell array 219_2.

The external information input circuit 201 may receive the external information CA for the read operation, on the basis of the external signal CS, and thereby, may generate the read command pulse RD for the read operation, the burst mode signal BL for setting the burst mode and the address ADD for the read operation. The external information input circuit 201 may generate the read command pulse RD by decoding the external information CA for the read operation, on the basis of the external signal CS. The external information input circuit 201 may generate the burst mode signal BL by extracting the external information CA for the read operation, on the basis of the external signal CS. The external information input circuit 201 may generate the address ADD from the external information CA for the read operation, on the basis of the external signal CS. At each time of receiving the external information CA for the read operation in the first burst mode, on the basis of the external signal CS, the external information input circuit 201 may generate the read command pulse RD, the burst mode signal BL for the first burst mode and the address ADD. At each time of receiving the external information CA for the read operation in the second burst mode, on the basis of the external signal CS, the external information input circuit 201 may generate the read command pulse RD, the burst mode signal BL for the second burst mode and the address ADD. The external information CA for the read operation in the second burst mode may be successively transmitted to the external information input circuit 201 with the preset interval. Namely, the read operation in the second burst mode may include the first and second read operations that are successively performed with the preset interval. When successively receiving, with the preset interval, the external information CA for the read operation in the second burst mode, the external information input circuit 201 may sequentially generate the read command pulse RD, the burst mode signal BL and the address ADD for the first and second read operations. Combinations of the address ADD for the first and second read operations may be set as corresponding combinations. For example, the combination of the address ADD for the second read operation may be set as a combination in which some bits are different from the combination of the address ADD for the first read operation. For example, when the combination of the address ADD for the first read operation is set to 'L, L, L, L, L, L' corresponding to the first cell array 219_1, the combination of the address ADD for the second read operation may be set to 'L, L, L, L, L, H' corresponding to the second cell array 219_2. The operation of the external information input circuit 201 will be described later with reference to FIG. 3.

The write operation control circuit 203 may generate an internal read control pulse IRD_CTR, an internal read strobing pulse IRD_STB, an internal read address IRD_ADD, the write control pulse WT_CTR, a write strobing pulse WT_STB and a write address WT_ADD from the write command pulse WT and the address ADD on the basis of the clock CLK, the burst mode signal BL and a write latency signal WL. The write latency signal WL may be set as information on a write latency. The write latency signal WL may be generated from a mode register (not illustrated). The write control pulse WT_CTR may be activated to store the internal data ID and a parity PA in the cell arrays 219_1 to 219_I. The write control pulse WT_CTR may have a pulse width wider than the write command pulse WT to store the internal data ID and the parity PA in the cell arrays 219_1 to 219_I. The write strobing pulse WT_STB may be activated to output the write address WT_ADD for the write operation, as a column address CADD. The internal read control pulse IRD_CTR may be activated to perform an internal read operation of outputting the internal data ID and the parity PA, stored in the cell arrays 219_1 to 219_I, in the write operation. The internal read control pulse IRD_CTR may have a pulse width wider than the pulse width of the write command pulse WT in order to output the internal data ID and the parity PA, stored in the cell arrays 219_1 to 219_I, in the write operation. The internal read strobing pulse IRD_STB may be activated to output the internal read address IRD_ADD for the internal read operation, as the column address CADD.

When performing the write operation, the write operation control circuit 203 may generate the write strobing pulse WT_STB and the write control pulse WT_CTR from the write command pulse WT on the basis of the clock CLK, the write latency signal WL and the burst mode signal BL. At each time of performing the write operation, the write operation control circuit 203 may activate the write strobing pulse WT_STB after a period including the write latency elapses from a time point when the write command pulse WT is input on the basis of the clock CLK and the write latency signal WL. The period including the write latency may be set as a period for the write latency and the first burst length L. When performing the write operation in the first burst mode, the write operation control circuit 203 may activate the write control pulse WT_CTR after a period including the write latency elapses from a time point when the write command pulse WT is input on the basis of the clock CLK and the write latency signal WL. When performing the write operation in the second burst mode, the write operation control circuit 203 may control whether to generate the write control pulse WT_CTR from the write command pulse WT. For example, when performing the first write operation in the second burst mode, the write operation control circuit 203 may block the generation of the write control pulse WT_CTR from the write command pulse WT. When performing the second write operation in the second burst mode, the write operation control circuit 203 may activate the write control pulse WT_CTR after a period including the write latency elapses from a time point when the write command pulse WT is input on the basis of the clock CLK and the write latency signal WL. Accordingly, in an embodiment, when performing a burst mode involving successive write operations at a preset interval, the write operation control circuit 203 may block the generation of the write control pulse WT_CTR, having a wide pulse width, in a preceding write operation, and may generate the write control pulse WT...CTR for storing the internal data ID in the cell arrays 219_1 to 219_I, in a subsequent write operation, whereby it may be possible to stably perform the successive write operations.

When performing the write operation, the write operation control circuit 203 may generate the internal read strobing pulse IRD_STB and the internal read control pulse IRD_CTR from the write command pulse WT on the basis of the clock CLK, the write latency signal WL and the burst mode signal BL. At each time of performing the write operation, the write operation control circuit 203 may activate the internal read strobing pulse IRD_STB before a period including the write latency elapses from a time point when the write command pulse WT is input on the basis of the clock CLK and the write latency signal WL. The write operation control circuit 203 may control whether to generate the internal read control pulse IRD_CTR from the write command pulse WT, on the basis of the burst mode signal BL. For example, when performing the write operation in the first burst mode, the write operation control circuit 203 may activate the internal read control pulse IRD_CTR before a period including the write latency elapses from a time point when the write command pulse WT is input on the basis of the clock CLK and the write latency signal WL. When performing the first and second write operations in the second burst mode, the write operation control circuit 203 may block the generation of the internal read control pulse IRD_CTR from the write command pulse WT.

When performing the write operation, the write operation control circuit 203 may generate the internal read address IRD_ADD for the internal read operation and the write address WT_ADD for the write operation, on the basis of the clock CLK, the write latency signal WL and the write command pulse WT. A configuration and operation of the write operation control circuit 203 will be described later with reference to FIG. 4.

The internal read address latch circuit 205 may generate the column address CADD from the internal read address IRD_ADD on the basis of the internal read strobing pulse IRD_STB. The internal read address latch circuit 205 may latch the internal read address IRD_ADD in synchronization with the internal read strobing pulse IRD_STB, and may output the latched internal read address IRD_ADD as the column address CADD.

The write address latch circuit 207 may generate the column address CADD from the write address WT_ADD on the basis of the write strobing pulse WT_STB. The write address latch circuit 207 may latch the write address WT_ADD in synchronization with the write strobing pulse WT_STB, and may output the latched write address WT_ADD as the column address CADD.

The read operation control circuit 209 may generate the read control pulse RD_CTR, a read strobing pulse RD_STB and a read address RD_ADD from the read command pulse RD and the address ADD on the basis of the burst mode signal BL. The read control pulse RD_CTR may be activated to output the internal data ID and the parity PA stored in the cell arrays 219_1 to 219_I. The read control pulse RD_CTR may have a pulse width wider than the pulse width of the read command pulse RD in order to output the internal data ID and the parity PA stored in the cell arrays 219_1 to 219_I. The read strobing pulse RD_STB may be activated to output the read address RD_ADD for the read operation, as the column address CADD.

When performing the read operation, the read operation control circuit 209 may generate the read strobing pulse RD_STB and the read control pulse RD_CTR from the read command pulse RD on the basis of the burst mode signal BL. At each time of performing the read operation, the read operation control circuit 209 may receive the read command pulse RD and thereby activate the read strobing pulse RD_STB. When performing the read operation in the first burst mode, the read operation control circuit 209 may receive the read command pulse RD and thereby activate the read control pulse RD_CTR. When performing the read operation in the second burst mode, the read operation control circuit 209 may control whether to generate the read control pulse RD_CTR from the read command pulse RD. For example, when performing the first read operation in the second burst mode, the read operation control circuit 209 may receive the read command pulse RD and thereby activate the read control pulse RD_CTR. When performing the second read operation in the second burst mode, the read operation control circuit 209 may block the generation of the read control pulse RD_CTR from the read command pulse RD. Accordingly, in an embodiment, when performing a burst mode involving successive read operations at a preset interval, the read operation control circuit 209 may generate the read control pulse RD_CTR for outputting the internal data ID stored in the cell arrays 219_1 to 219_I, in a preceding read operation, and may block the generation of the read control pulse RD_CTR, having a wide pulse width, in a subsequent read operation, whereby it may be possible to stably perform the successive read operations.

When performing the read operation, the read operation control circuit 209 may generate the read address RD_ADD for the read operation from the address ADD on the basis of the read command pulse RD. A configuration and operation of the read operation control circuit 209 will be described later with reference to FIG. 8.

The read address latch circuit 211 may generate the column address CADD from the read address RD_ADD on the basis of the read strobing pulse RD_STB. The read address latch circuit 211 may latch the read address RD_ADD in synchronization with the read strobing pulse RD_STB, and may output the latched read address RD_ADD as the column address CADD.

The pad array 213 may include a plurality of data pads through which the data DQ is transmitted. The number of the data pads may be variously set depending on an embodiment. According to an embodiment, the data DQ may be transmitted through some data pads among the plurality of data pads. Each of the remaining data pads through which the data DQ is not transmitted may be coupled to one of a terminal of a power supply voltage and a terminal of a ground voltage. For example, among the plurality of data pads, first, second, third and fourth data pads may transmit first, second, third and fourth data DQ<1:4>, and each of the remaining data pads may be coupled to one of a terminal of the power supply voltage and a terminal of the ground voltage.

When performing the write operation, the data input/output circuit 215 may output write data WD by latching the data DQ on the basis of a write shift signal WTS. The write shift signal WTS may be generated by delaying the write command pulse WT by the write latency at each time of performing the write operation. When performing the read operation, the data input/output circuit 215 may output the data DQ by latching corrected data CD on the basis of a read shift signal RDS. The read shift signal RDS may be generated by delaying the read command pulse RD by the read latency at each time of performing the read operation.

When performing the write operation in the first burst mode, the data input/output circuit 215 may output the write data WD by receiving the plurality of data DQ<1:N> having the first burst length L. That is to say, when performing the write operation in the first burst mode, the data input/output circuit 215 may output the write data WD by receiving the data DQ having L x N bits. For example, when performing the write operation in the first burst mode, the data input/output circuit 215 may output the write data WD by receiving the data DQ having 64 (16 x 4) bits. When performing the first write operation in the second burst mode, the data input/output circuit 215 may output the write data WD by receiving the plurality of data DQ<1:N> having one half of the second burst length 2L. When performing the second write operation in the second burst mode, the data input/output circuit 215 may output the write data WD by receiving the plurality of data DQ<1:N> having the other half of the second burst length 2L. In the second burst mode, by successively performing the first and second write operations with the preset interval, the data input/output circuit 215 may output the write data WD by receiving the plurality of data DQ<1:N> having the second burst length 2L. In other words, when performing the first and second write operations in the second burst mode, the data input/output circuit 215 may output the write data WD by receiving the data DQ having 2L x N bits. For example, when performing the first and second write operations in the second burst mode, the data input/output circuit 215 may output the write data WD by receiving the data DQ having 128 (32 x 4) bits.

When performing the read operation in the first burst mode, the data input/output circuit 215 may output the plurality of data DQ<1:N> having the first burst length L by receiving the corrected data CD. Namely, when performing the read operation in the first burst mode, the data input/output circuit 215 may output the data DQ having L x N bits by receiving the corrected data CD. For example, when performing the read operation in the first burst mode, the data input/output circuit 215 may output the data DQ having 64 (16 x 4) bits by receiving the corrected data CD. When performing the first read operation in the second burst mode, the data input/output circuit 215 may output the plurality of data DQ<1:N> having one half of the second burst length 2L by receiving the corrected data CD. When performing the second read operation in the second burst mode, the data input/output circuit 215 may output the plurality of data DQ<1:N> having the other half of the second burst length 2L by receiving the corrected data CD. In the second burst mode, by successively performing the first and second read operations with the preset interval, the data input/output circuit 215 may output the plurality of data DQ<1:N> having the second burst length 2L by receiving the corrected data CD. That is to say, when performing the first and second read operations in the second burst mode, the data input/output circuit 215 may output the data DQ having 2L x N bits by receiving the corrected data CD. For example, when performing the first and second read operations in the second burst mode, the data input/output circuit 215 may output the data DQ having 128 (32 x 4) bits by receiving the corrected data CD.

When performing the write operation, the error correction circuit 217 may output the internal data ID by receiving the write data WD. When performing the write operation, the error correction circuit 217 may generate the parity PA by encoding the write data WD. For example, when performing the write operation, the error correction circuit 217 may generate the parity PA having 8 bits by encoding the write data WD having 128 bits. When performing the read operation, the error correction circuit 217 may correct an error of the internal data ID on the basis of the parity PA, and may output the error-corrected internal data ID as the corrected data CD. For example, when performing the read operation, the error correction circuit 217 may correct an error of the internal data ID having 128 bits on the basis of the parity PA having 8 bits, and thereby, may generate the corrected data CD having 128 bits. When a size of the data DQ transmitted and received to and from the memory controller 110 (see FIG. 1) in one column operation is smaller than a size of the data DQ for correcting an error of the internal data ID, the error correction circuit 217 may quickly perform an error correction calculation through a burst mode involving successive column operations.

The data storage circuit 219 may include the cell arrays 219_1 to 219_I which store the internal data ID and the parity PA. Each of the cell arrays 219_1 to 219_I may store the internal data ID having L X N bits. For example, each of the cell arrays 219_1 to 219_I may store the internal data ID having 64 (16 X 4) bits.

When performing the write operation on the basis of the write control pulse WT_CTR, the column operation control circuit 221 may store the internal data ID and the parity PA in cell arrays selected among the cell arrays 219_1 to 219_I according to a combination of the column address CADD. When performing the internal read operation in the write operation on the basis of the internal read control pulse IRD_CTR, the column operation control circuit 221 may output the internal data ID and the parity PA stored in cell arrays selected among the cell arrays 219_1 to 219_I according to a combination of the column address CADD. When performing the read operation on the basis of the read control pulse RD_CTR, the column operation control circuit 221 may output the internal data ID and the parity PA stored in cell arrays selected among the cell arrays 219_1 to 219_I according to a combination of the column address CADD. The column address CADD may have a combination corresponding to each of the cell arrays 219_1 to 219_I. The column operation control circuit 221 may select at least one of the cell arrays 219_1 to 219_I according to a combination of the column address CADD. For example, when a combination of the column address CADD corresponds to the first cell array 219_1, the column operation control circuit 221 may select the first cell array 219_1 and the second cell array 219_2 corresponding to the first cell array 219_1. For another example, when a combination of the column address CADD corresponds to the second cell array 219_2, the column operation control circuit 221 may select the second cell array 219_2 and the first cell array 219_1 corresponding to the second cell array 219_2.

FIG. 3 is a table for explaining the operation of the external information input circuit 201 illustrated in FIG. 2. The external information input circuit 201 may generate the write command pulse WT for the write operation, the read command pulse RD for the read operation, the burst mode signal BL for setting the burst mode and first to sixth addresses ADD<1:6> on the basis of the external signal CS and first to sixth external information CA<1:6>.

When the external signal CS is set to a logic high level H, the external information input circuit 201 may generate the write command pulse WT by decoding the first to fifth external information CA<1:5> having a first combination A for the write operation. The first combination A may be set to 'H, L, H, H, L.' When the external signal CS is set to a logic high level H, the external information input circuit 201 may generate the burst mode signal BL from the sixth external information CA<6> by extracting the external information CA for the write operation. The burst mode signal BL may have a logic high level H to set the burst mode to the first burst mode in the write operation. The burst mode signal BL may have a logic low level L to set the burst mode to the second burst mode in the write operation. When the external signal CS is set to a logic low level L, the external information input circuit 201 may generate the first to sixth addresses ADD<1:6> from the first to sixth external information CA<1:6> for the write operation.

When the external signal CS is set to a logic high level H, the external information input circuit 201 may generate the read command pulse RD by decoding the first to fifth external information CA<1:5> having a second combination B for the read operation. The second combination B may be set to 'H, L, H, H, H.' When the external signal CS is set to a logic high level H, the external information input circuit 201 may generate the burst mode signal BL from the sixth external information CA<6> by extracting the external information CA for the read operation. The burst mode signal BL may have a logic high level H to set the burst mode to the first burst mode in the read operation. The burst mode signal BL may have a logic low level L to set the burst mode to the second burst mode in the read operation. When the external signal CS is set to a logic low level L, the external information input circuit 201 may generate the first to sixth addresses ADD<1:6> from the first to sixth external information CA<1:6> for the read operation.

FIG. 4 is a block diagram illustrating a configuration of an example of the write operation control circuit 203 illustrated in FIG. 2. As illustrated in FIG. 4, the write operation control circuit 203 may include a write shift circuit (WRITE SHIFT CIRCUIT) 231, a pipe circuit (PIPE CIRCUIT) 233, an internal read control pulse generation circuit (IRD_CTR GEN) 235, and a write control pulse generation circuit (WT_CTR GEN) 237.

The write shift circuit 231 may generate a pre-internal read control pulse PRE_IRD_CTR, a pre-write control pulse PRE_WT_CTR, the internal read strobing pulse IRD_STB and the write strobing pulse WT_STB from the write command pulse WT on the basis of the write latency signal WL in synchronization with the clock CLK. When performing the write operation, the write shift circuit 231 may generate the pre-write control pulse PRE_WT_CTR and the write strobing pulse WT_STB by sliifting the write command pulse WT by a period including the write latency on the basis of the write latency signal WL in synchronization with the clock CLK. When performing the write operation, the write shift circuit 231 may generate the pre-internal read control pulse PRE_IRD_CTR and the internal read strobing pulse IRD_STB by shifting the write command pulse WT by less than a period including the write latency on the basis of the write latency signal WL in synchronization with the clock CLK.

The pipe circuit 233 may generate an internal read burst mode signal IRD_BL, a write burst mode signal WT_BL, the internal read address IRD_ADD and the write address WT_ADD from the burst mode signal BL and the address ADD on the basis of the write command pulse WT, the internal read strobing pulse IRD_STB and the write strobing pulse WT_STB. Each of the internal read burst mode signal IRD_BL and the write burst mode signal WT_BL may be generated to set the burst mode to one of the first and second burst modes in the write operation. The pipe circuit 233 may receive and latch the burst mode signal BL and the address ADD each time the write command pulse WT is input. Each time the internal read strobing pulse IRD_STB is input, the pipe circuit 233 may output the latched burst mode signal BL and the latched address ADD as the internal read burst mode signal IRD_BL and the internal read address IRD_ADD, respectively. Each time the write strobing pulse WT_STB is input, the pipe circuit 233 may output the latched burst mode signal BL and the latched address ADD as the write burst mode signal WT_BL and the write address WT_ADD, respectively. A detailed configuration and operation of the pipe circuit 233 will be described later with reference to FIG. 5.

The internal read control pulse generation circuit 235 may generate the internal read control pulse IRD_CTR from the pre-internal read control pulse PRE_IRD_CTR on the basis of the internal read burst mode signal IRD_BL. The internal read control pulse generation circuit 235 may control whether to generate the internal read control pulse IRD_CTR, on the basis of the internal read burst mode signal IRD_BL when the pre-internal read control pulse PRE_IRD_CTR is input. For example, when performing the write operation in the first burst mode on the basis of the internal read burst mode signal IRD_BL, the internal read control pulse generation circuit 235 may output the internal read control pulse IRD_CTR by widening the pulse width of the pre-internal read control pulse PRE_IRD_CTR. When performing the first and second write operations in the second burst mode on the basis of the internal read burst mode signal IRD_BL, the internal read control pulse generation circuit 235 may block the generation of the internal read control pulse IRD_CTR from the pre-internal read control pulse PRE_IRD_CTR. A configuration and operation of the internal read control pulse generation circuit 235 will be described later with reference to FIG. 6.

The write control pulse generation circuit 237 may generate the write control pulse WT_CTR from the pre-write control pulse PRE_WT_CTR on the basis of the write burst mode signal WT_BL. The write control pulse generation circuit 237 may control whether to generate the write control pulse WT_CTR, on the basis of the write burst mode signal WT_BL when the pre-write control pulse PRE_WT_CTR is input. For example, when performing the write operation in the first burst mode on the basis of the write burst mode signal WT_BL, the write control pulse generation circuit 237 may output the write control pulse WT_CTR by widening the pulse width of the pre-write control pulse PRE_WT_CTR. When performing the first write operation in the second burst mode on the basis of the write burst mode signal WT_BL, the write control pulse generation circuit 237 may block the generation of the write control pulse WT_CTR from the pre-write control pulse PRE_WT_CTR. When performing the second write operation in the second burst mode on the basis of the write burst mode signal WT_BL, the write control pulse generation circuit 237 may output the write control pulse WT_CTR by widening the pulse width of the pre-write control pulse PRE_WT_CTR. A configuration and operation of the write control pulse generation circuit 237 will be described later with reference to FIG. 7.

FIG. 5 is a block diagram illustrating a configuration of an example of the pipe circuit 233 illustrated in FIG. 4. As illustrated in FIG. 5, the pipe circuit 233 may include an input control signal generation circuit (PIN GEN) 241, a first output control signal generation circuit (IRD_POUT GEN) 243, a second output control signal generation circuit (WT_POUT GEN) 245, a first pipe latch circuit (PIPE LATCH) 247, and a second pipe latch circuit (PIPE LATCH) 249.

The input control signal generation circuit 241 may generate an input control signal PIN on the basis of the write command pulse WT. The input control signal generation circuit 241 may sequentially activate the input control signal PIN by counting the number of input times of the write command pulse WT. For example, the input control signal generation circuit 241 may activate a first input control signal PIN<1> when the write command pulse WT is input for the first time. Then, the input control signal generation circuit 241 may activate a second input control signal PIN<2> when the write command pulse WT is input for the second time.

The first output control signal generation circuit 243 may generate an internal read output control signal IRD_POUT on the basis of the internal read strobing pulse IRD_STB. The first output control signal generation circuit 243 may sequentially activate the internal read output control signal IRD_POUT by counting the number of input times of the internal read strobing pulse IRD_STB.

The second output control signal generation circuit 245 may generate a write output control signal WT_POUT on the basis of the write strobing pulse WT_STB. The second output control signal generation circuit 245 may sequentially activate the write output control signal WT_POUT by counting the number of input times the write strobing pulse WT_STB.

The first pipe latch circuit 247 may generate the internal read burst mode signal IRD_BL and the write burst mode signal WT_BL from the burst mode signal BL on the basis of the input control signal PIN, the internal read output control signal IRD_POUT and the write output control signal WT_POUT. The first pipe latch circuit 247 may include a plurality of latch circuits (not illustrated). The first pipe latch circuit 247 may latch the burst mode signal BL when the input control signal PIN is activated. For example, when the first input control signal PIN<1> is activated, the first pipe latch circuit 247 may receive and latch the burst mode signal BL in a first latch circuit. When the second input control signal PIN<2> is activated, the first pipe latch circuit 247 may receive and latch the burst mode signal BL in a second latch circuit. When the internal read output control signal IRD_POUT is activated, the first pipe latch circuit 247 may output the latched burst mode signal BL as the internal read burst mode signal IRD_BL. For example, when a first internal read output control signal IRD_POUT <1> is activated, the first pipe latch circuit 247 may output the burst mode signal BL, latched in the first latch circuit, as the internal read burst mode signal IRD_BL. When a second internal read output control signal IRD_POUT<2> is activated, the first pipe latch circuit 247 may output the burst mode signal BL, latched in the second latch circuit, as the internal read burst mode signal IRD_BL. When the write output control signal WT_POUT is activated, the first pipe latch circuit 247 may output the latched burst mode signal BL as the write burst mode signal WT_BL. For example, when a first write output control signal WT_POUT<1> is activated, the first pipe latch circuit 247 may output the burst mode signal BL, latched in the first latch circuit, as the write burst mode signal WT_BL. When a second write output control signal WT_POUT<2> is activated, the first pipe latch circuit 247 may output the burst mode signal BL, latched in the second latch circuit, as the write burst mode signal WT_BL.

The second pipe latch circuit 249 may generate the internal read address IRD_ADD and the write address WT_ADD from the address ADD on the basis of the input control signal PIN, the internal read output control signal IRD_POUT and the write output control signal WT_POUT. The second pipe latch circuit 249 may include a plurality of latch circuits (not illustrated). The second pipe latch circuit 249 may latch the address ADD when the input control signal PIN is activated. When the internal read output control signal IRD_POUT is activated, the second pipe latch circuit 249 may output the latched address ADD as the internal read address IRD_ADD. When the write output control signal WT_POUT is activated, the second pipe latch circuit 249 may output the latched address ADD as the write address WT_ADD. The operation of the second pipe latch circuit 249 may be implemented in the same manner as the operation of the first pipe latch circuit 247.

FIG. 6 is a diagram illustrating an example of the internal read control pulse generation circuit 235 illustrated in FIG. 4. As illustrated in FIG. 6, the internal read control pulse generation circuit 235 may include a first internal pulse generation circuit (IPUL1 GEN) 251 and a first pulse width adjustment circuit 253.

The first internal pulse generation circuit 251 may generate a first internal pulse IPUL1 on the basis of the pre-internal read control pulse PRE_IRD_CTR and the internal read burst mode signal IRD_BL. The first internal pulse generation circuit 251 may control whether to generate the first internal pulse IPUL1 from the pre-internal read control pulse PRE_IRD_CTR, on the basis of theinternal read burst mode signal IRD_BL. For example, the first internal pulse generation circuit 251 may generate the first internal pulse IPUL1 when the pre-internal read control pulse PRE_IRD_CTR is input in the first burst mode. The first internal pulse generation circuit 251 may block the generation of the first internal pulse IPUL1 when the pre-internal read control pulse PRE_IRD_CTR is input in the second burst mode.

The first pulse width adjustment circuit 253 may output the internal read control pulse IRD_CTR by widening the pulse width of the first internal pulse IPUL1. The first pulse width adjustment circuit 253 may include delay circuits (DLY) 253_1, 253_2 and 253_6 and NAND gates 253_3, 253_4 and 253_5. The first pulse width adjustment circuit 253 may activate the internal read control pulse IRD_CTR on the basis of the first internal pulse IPUL1 through the delay circuit 253_1, the delay circuit 253_2, the NAND gate 253_3 and the NAND gate 253_4. When the internal read control pulse IRD_CTR is activated, the first pulse width adjustment circuit 253 may maintain the activated state of the internal read control pulse IRD_CTR through the NAND gate 253_5 and the NAND gate 253_4. The first pulse width adjustment circuit 253 may deactivate the internal read control pulse IRD_CTR after a delay period of the delay circuit 253_6 elapses from a time point when the internal read control pulse IRD_CTR is activated through the delay circuit 253_6, the NAND gate 253_5 and the NAND gate 253_4. The NAND gate 253_5 may initialize the logic level of the internal read control pulse IRD_CTR on the basis of a reset signal RST which is generated in an initialization operation.

FIG. 7 is a circuit diagram illustrating an example of the write control pulse generation circuit 237 illustrated in FIG. 4. As illustrated in FIG. 7, the write control pulse generation circuit 237 may include a write masking signal generation circuit 261, a second internal pulse generation circuit 263 and a second pulse width adjustment circuit 265.

The write masking signal generation circuit 261 may generate a write masking signal WT_MASK on the basis of the pre-write control pulse PRE_WT_CTR and the write burst mode signal WT_BL. The write burst mode signal WT_BL may have a logic low level to set the burst mode to the first burst mode in the write operation. The write burst mode signal WT_BL may have a logic high level to set the burst mode to the second burst mode in the write operation. When the pre-write control pulse PRE_WT_CTR is input in the first burst mode based on the write burst mode signal WT_BL, the write masking signal generation circuit 261 may deactivate the write masking signal WT_MASK. When the pre-write control pulse PRE_WT_CTR is input a preset number of times in the second burst mode based on the write burst mode signal WT_BL, the write masking signal generation circuit 261 may activate the write masking signal WT_MASK. In the write masking signal generation circuit 261, the preset number of times may be set to an odd number. For example, when the pre-write control pulse PRE_WT_CTR is input for the first time in the second burst mode, the write masking signal generation circuit 261 may activate the write masking signal WT_MASK. Thereafter, when the pre-write control pulse PRE_WT_CTR is input for the second time in the second burst mode, the write masking signal generation circuit 261 may deactivate the write masking signal WT_MASK. The write masking signal generation circuit 261 may include a NAND gate 261_1 and a flip-flop (F/F) 261_2. The NAND gate 261_1 may receive the write masking signal WT_MASK and the write burst mode signal WT_BL, may perform a NAND logic operation, and may output an output signal to the flip-flop 261_2. The flip-flop 261_2 may output the write masking signal WT_MASK by latching the output signal of the NAND gate 261_1 in synchronization with the pre-write control pulse PRE_WT_CTR. The flip-flop 261_2 may initialize the write masking signal WT_MASK to a logic high level on the basis of an inverted reset signal RSTB which is generated in the initialization operation.

The second internal pulse generation circuit 263 may generate a second internal pulse IPUL2 on the basis of the write masking signal WT_MASK and the pre-write control pulse PRE_WT_CTR. The second internal pulse generation circuit 263 may control whether to generate the second internal pulse IPUL2 from the pre-write control pulse PRE_WT_CTR, on the basis of the write masking signal WT_MASK. For example, the second internal pulse generation circuit 263 may output the second internal pulse IPUL2 by buffering the pre-write control pulse PRE_WT_CTR when the write masking signal WT_MASK is deactivated. The second internal pulse generation circuit 263 may block the generation of the second internal pulse IPUL2 from the pre-write control pulse PRE_WT_CTR when the write masking signal WT_MASK is activated. The second internal pulse generation circuit 263 may include a delay circuit (DLY) 263_1, a NAND gate 263_2 and an inverter 263_3. The delay circuit 263_1 may delay the pre-write control pulse PRE_WT_CTR by a predetermined delay period and thereby generate the delayed pre-write control pulse PRE_WT_CTR. The NAND gate 263_2 may receive the write masking signal WT_MASK and the delayed pre-write control pulse PRE_WT_CTR, may perform a NAND logic operation, and may output an output signal to an input terminal of the inverter 263_3. The inverter 263_3 may invert and buffer the output signal of the NAND gate 263_2, and may output the second internal pulse IPUL2.

The second pulse width adjustment circuit 265 may output the write control pulse WT_CTR by widening the pulse width of the second internal pulse IPUL2. The second pulse width adjustment circuit 265 may include delay circuits (DLY) 265_1, 265_2 and 265_6 and NAND gates 265_3, 265_4 and 265_5. Since the operation of the second pulse width adjustment circuit 265 is implemented in the same manner as the operation of the first pulse width adjustment circuit 253 illustrated in FIG. 6, detailed description thereof will be omitted herein.

FIG. 8 is a block diagram illustrating a configuration of an example of the read operation control circuit 209 illustrated in FIG. 2. As illustrated in FIG. 8, the read operation control circuit 209 may include a read pulse generation circuit (READ PULSE GEN) 271, a burst mode signal latch circuit (BL LATCH) 273, an address latch circuit (ADD LATCH) 275 and a read control pulse generation circuit (RD_CTR GEN) 277.

When performing the read operation, the read pulse generation circuit 271 may generate each of a pre-read control pulse PRE_RD_CTR and the read strobing pulse RD_STB from the read command pulse RD.

The burst mode signal latch circuit 273 may generate a read burst mode signal RD_BL from the burst mode signal BL on the basis of the read command pulse RD. The burst mode signal latch circuit 273 may output the read burst mode signal RD_BL by latching the burst mode signal BL when the read command pulse RD is input. The read burst mode signal RD_BL may be generated to set the burst mode to one of the first and second burst modes in the read operation.

The address latch circuit 275 may generate the read address RD_ADD from the address ADD on the basis of the read command pulse RD. The address latch circuit 275 may output the read address RD_ADD by latching the address ADD when the read command pulse RD is input.

The read control pulse generation circuit 277 may generate the read control pulse RD_CTR from the pre-read control pulse PRE_RD_CTR on the basis of the read burst mode signal RD_BL. The read control pulse generation circuit 277 may control whether to generate the read control pulse RD_CTR, on the basis of the read burst mode signal RD_BL when the pre-read control pulse PRE_RD_CTR is input. For example, when performing the read operation in the first burst mode on the basis of the read burst mode signal RD_BL, the read control pulse generation circuit 277 may output the read control pulse RD_CTR by widening the pulse width of the pre-read control pulse PRE_RD_CTR. When performing the first read operation in the second burst mode on the basis of the read burst mode signal RD_BL, the read control pulse generation circuit 277 may output the read control pulse RD_CTR by widening the pulse width of the pre-read control pulse PRE_RD_CTR. When performing the second read operation in the second burst mode on the basis of the read burst mode signal RD_BL, the read control pulse generation circuit 277 may block the generation of the read control pulse RD_CTR from the pre-read control pulse PRE_RD_CTR. A configuration and operation of the read control pulse generation circuit 277 will be described below with reference to FIG. 9.

FIG. 9 is a circuit diagram illustrating an example of the read control pulse generation circuit 277 illustrated in FIG. 8. As illustrated in FIG. 9, the read control pulse generation circuit 277 may include a read masking signal generation circuit 281, a third internal pulse generation circuit 283 and a third pulse width adjustment circuit 285.

The read masking signal generation circuit 281 may generate a read masking signal RD_MASK on the basis of the pre-read control pulse PRE_RD_CTR and the read burst mode signal RD_BL. The read burst mode signal RD_BL may have a logic low level to set the burst mode to the first burst mode in the read operation. The read burst mode signal RD_BL may have a logic high level to set the burst mode to the second burst mode in the read operation. When the pre-read control pulse PRE_RD_CTR is input in the first burst mode based on the read burst mode signal RD_BL, the read masking signal generation circuit 281 may deactivate the read masking signal RD_MASK. When the pre-read control pulse PRE_RD_CTR is input a preset number of times in the second burst mode based on the read burst mode signal RD_BL, the read masking signal generation circuit 281 may activate the read masking signal RD_MASK. In the read masking signal generation circuit 281, the preset number of times may be set to an even number. For example, when the pre-read control pulse PRE_RD_CTR is input for the first time in the second burst mode, the read masking signal generation circuit 281 may deactivate the read masking signal RD_MASK. Thereafter, when the pre-read control pulse PRE_RD_CTR is input for the second time in the second burst mode, the read masking signal generation circuit 281 may activate the read masking signal RD_MASK. The read masking signal generation circuit 281 may include flip-flops (F/F) 281_1 and 281_3 and NAND gates 281_2 and 281_4. The flip-flop 281_1 may output a first latched read burst mode signal RD_BL_LAT1 by latching the read burst mode signal RD_BL in synchronization with the pre-read control pulse PRE_RD_CTR. The flip-flop 281_1 may initialize the first latched read burst mode signal RD_BL_LAT1 to a logic low level on the basis of the reset signal RST which is generated in the initialization operation. The NAND gate 281_2 may receive a second latched read burst mode signal RD_BL_LAT2 and the read burst mode signal RD_ BL, may perform a NAND logic operation, and may output an output signal to the flip-flop 281_3. The flip-flop 281_3 may output the second latched read burst mode signal RD_BL_LAT2 by latching the output signal of the NAND gate 281_2 in synchronization with the pre-read control pulse PRE_RD_CTR. The flip-flop 281_3 may initialize the second latched read burst mode signal RD_BL_LAT2 to a logic high level on the basis of the inverted reset signal RSTB which is generated in the initialization operation. The NAND gate 281_4 may receive the first latched read burst mode signal RD_ BL_LAT1 and the second latched read burst mode signal RD_BL_LAT2, may perform a NAND logic operation, and may output the read masking signal RD_MASK.

The third internal pulse generation circuit 283 may generate a third internal pulse IPUL3 on the basis of the read masking signal RD_MASK and the pre-read control pulse PRE...RD....CTR. The third internal pulse generation circuit 283 may control whether to generate the third internal pulse IPUL3 from the pre-read control pulse PRE_RD_CTR, on the basis of the read masking signal RD_MASK. For example, the third internal pulse generation circuit 283 may output the third internal pulse IPUL3 by buffering the pre-read control pulse PRE_RD_CTR when the read masking signal RD_MASK is deactivated. The third internal pulse generation circuit 283 may block the generation of the third internal pulse IPUL3 from the pre-read control pulse PRE_RD_CTR when the read masking signal RD_MASK is activated. The third internal pulse generation circuit 283 may include a delay circuit (DLY) 283_1, a NAND gate 283_2 and an inverter 283_3. The delay circuit 283_1 may delay the pre-read control pulse PRE_RD_CTR by a predetermined delay period and thereby generate the delayed pre-read control pulse PRE_RD_CTR. The NAND gate 283_2 may receive the read masking signal RD_MASK and the delayed pre-read control pulse PRE_RD_CTR, may perform a NAND logic operation, and may output an output signal to an input terminal of the inverter 283_3. The inverter 283_3 may invert and buffer the output signal of the NAND gate 283_2, and may output the third internal pulse IPUL3.

The third pulse width adjustment circuit 285 may output the read control pulse RD_CTR by widening the pulse width of the third internal pulse IPUL3. The third pulse width adjustment circuit 285 may include delay circuits (DLY) 285_1, 285_2 and 285_6 and NAND gates 285_3, 285_4 and 285_5. Since the operation of the third pulse width adjustment circuit 285 is implemented in the same manner as the operation of the first pulse width adjustment circuit 253 illustrated in FIG. 6, detailed description thereof will be omitted herein.

FIG. 10 is a timing diagram for explaining the write operation in the first burst mode performed in the memory device 120 illustrated in FIG. 2.

The external information input circuit 201 may generate the write command pulse WT by receiving the external information CA for the write operation in the first burst mode, on the basis of the clock CLK and the external signal CS.

The external information input circuit 201 may generate the burst mode signal BL having a logic high level H by receiving the external information CA for the write operation in the first burst mode, on the basis of the clock CLK and the external signal CS.

When performing the write operation in the first burst mode based on the burst mode signal BL, the write operation control circuit 203 may generate the internal read control pulse IRD_CTR by shifting the write command pulse WT by less than a period td including a write latency period.

When performing the write operation in the first burst mode based on the burst mode signal BL, the write operation control circuit 203 may generate each of the write strobing pulse WT_STB and the pre-write control pulse PRE_WT_CTR (see FIG. 4) by shifting the write command pulse WT by the period td including the write latency period.

When performing the write operation in the first burst mode based on the burst mode signal BL, the write operation control circuit 203 may deactivate the write masking signal WT_MASK (see FIG. 7) to a logic high level H.

The write operation control circuit 203 may generate the write control pulse WT_CTR having a pulse width PW2 by widening a pulse width PW1 of the pre-write control pulse PRE_WT_CTR (see FIG. 4) on the basis of the deactivated write masking signal WT_MASK.

FIG. 11 is a timing diagram for explaining the write operation in the second burst mode performed in the memory device 120 illustrated in FIG. 2.

The external information input circuit 201 may successively receive the external information CA for the write operation in the second burst mode, with a preset interval tCCD (T11 and T12). The external information input circuit 201 may sequentially generate the write command pulse WT by successively receiving the external information CA for the first and second write operations in the second burst mode, on the basis of the clock CLK and the external signal CS with the preset interval tCCD. The external information input circuit 201 may sequentially generate the burst mode signal BL having a logic low level by successively receiving the external information CA for the first and second write operations in the second burst mode, on the basis of the clock CLK and the external signal CS with the preset interval tCCD.

When performing the first and second write operations in the second burst mode based on the burst mode signal BL, the write operation control circuit 203 may deactivate the internal read control pulse IRD_CTR for the internal read operation to a logic low level L.

When performing the first and second write operations in the second burst mode based on the burst mode signal BL, the write operation control circuit 203 may generate each of the write strobing pulse WT_STB and the pre-write control pulse PRE_WT_CTR (see FIG. 4) by shifting the write command pulse WT by the period td including the write latency period.

When performing the first write operation in the second burst mode based on the burst mode signal BL, the write operation control circuit 203 may activate the write masking signal WT_MASK (see FIG. 7) to a logic low level. When performing the first write operation in the second burst mode, the write operation control circuit 203 may block the generation of the write control pulse WT_CTR from the pre-write control pulse PRE_WT_CTR (see FIG. 4), on the basis of the activated write masking signal WT_MASK.

When performing the second write operation in the second burst mode based on the burst mode signal BL, the write operation control circuit 203 may deactivate the write masking signal WT_MASK (see FIG. 7) to a logic high level. When performing the second write operation in the second burst mode, the write operation control circuit 203 may generate the write control pulse WT_CTR having the pulse width PW2 by widening the pulse width PW1 of the pre-write control pulse PRE_WT_CTR (see FIG. 4) on the basis of the deactivated write masking signal WT_MASK.

FIG. 12 is a timing diagram for explaining the read operation in the first burst mode performed in the memory device 120 illustrated in FIG. 2.

The external information input circuit 201 may generate the read command pulse RD by receiving the external information CA for the read operation in the first burst mode, on the basis of the clock CLK and the external signal CS.

The external information input circuit 201 may generate the burst mode signal BL having a logic high level H by receiving the external information CA for the read operation in the first burst mode, on the basis of the clock CLK and the external signal CS.

When performing the read operation in the first burst mode based on the burst mode signal BL, the read operation control circuit 209 may generate each of the read strobing pulse RD_STB and the pre-read control pulse PRE_RD_CTR (see FIG. 8) from the read command pulse RD.

When performing the read operation in the first burst mode based on the burst mode signal BL, the read operation control circuit 209 may deactivate the read masking signal RD_MASK (see FIG. 9) to a logic high level H.

The read operation control circuit 209 may generate the read control pulse RD_CTR having a pulse width PW4 by widening a pulse width PW3 of the pre-read control pulse PRE_RD_CTR (see FIG. 8) on the basis of the deactivated read masking signal RD_MASK.

FIG. 13 is a timing diagram for explaining the read operation in the second burst mode performed in the memory device 120 illustrated in FIG. 2.

The external information input circuit 201 may successively receive the external information CA for the read operation in the second burst mode, with a preset interval tCCD (T21 and T22). The external information input circuit 201 may sequentially generate the read command pulse RD by successively receiving the external information CA for the first and second read operations in the second burst mode, on the basis of the clock CLK and the external signal CS with the preset interval tCCD. The external information input circuit 201 may sequentially generate the burst mode signal BL having a logic low level by successively receiving the external information CA for the first and second read operations in the second burst mode, on the basis of the clock CLK and the external signal CS with the preset interval tCCD.

When performing the first and second read operations in the second burst mode based on the burst mode signal BL, the read operation control circuit 209 may generate each of the read strobing pulse RD_STB and the pre-read control pulse PRE_RD_CTR (see FIG. 8) from the read command pulse RD.

When performing the first read operation in the second burst mode based on the burst mode signal BL, the read operation control circuit 209 may deactivate the read masking signal RD_MASK (see FIG. 9) to a logic high level. When performing the first read operation in the second burst mode, the read operation control circuit 209 may generate the read control pulse RD_CTR having the pulse width PW4 by widening the pulse width PW3 of the pre-read control pulse PRE_RD_CTR (see FIG. 8) on the basis of the deactivated read masking signal RD_MASK.

When performing the second read operation in the second burst mode based on the burst mode signal BL, the read operation control circuit 209 may activate the read masking signal RD_MASK (see FIG. 9) to a logic low level. When performing the second read operation in the second burst mode, the read operation control circuit 209 may block the generation of the read control pulse RD_CTR from the pre-read control pulse PRE_RD_CTR (see FIG. 8), on the basis of the activated read masking signal RD_MASK, FIG. 14 is a flowchart for explaining the write operation performed in the memory device 120 illustrated in FIG. 2.

At step S101, the external information input circuit 201 may generate the write command pulse WT and the burst mode signal BL on the basis of the external information CA for the write operation. The data input/output circuit 215 may receive the data DQ at a time point when the write latency elapses, on the basis of the write shift pulse WTS generated by delaying the write command pulse WT at each time of performing the write operation.

At step S103, the write operation control circuit 203 may determine to which one of the first burst mode and the second burst mode the burst mode is set, on the basis of the burst mode signal BL.

When the burst mode is set to the first burst mode at the step S103, the write operation control circuit 203 may perform step S105. At the step S105, the write operation control circuit 203 may generate the internal read control pulse IRD_CTR for performing the internal read operation of outputting the internal data ID stored in the cell arrays 219_1 to 219_I. The data input/output circuit 215 may generate the write data WD by replacing some of the internal data ID output in the internal read operation with the data DQ received from the outside. The error correction circuit 217 may generate the internal data ID and the parity PA on the basis of the write data WD. At step S107, the write operation control circuit 203 may generate the write control pulse WT_CTR for storing the internal data ID and the parity PA in the cell arrays 219_1 to 219_I by widening the pulse width of the pre-write control pulse PRE_WT _CTR (see FIG. 4). By this, the write operation in the first burst mode may be ended.

When the burst mode is set to the second burst mode at the step S103, the write operation control circuit 203 may perform step S109. At the step S109, the write operation control circuit 203 may block the generation of the internal read control pulse IRD_CTR for outputting the internal data ID stored in the cell arrays 219_1 to 219_I.

At step S111, the write operation control circuit 203 may determine whether the write operation performed in the second burst mode is the first write operation, on the basis of the burst mode signal BL and the write command pulse WT.

When the write operation performed in the second burst mode is the first write operation at the step S111, the write operation control circuit 203 may perform step S113. At the step S113, the write operation control circuit 203 may block the generation of the write control pulse WT_CTR for storing the internal data ID in the cell arrays 219_1 to 219_I. By this, the first write operation in the second burst mode may be ended.

When the write operation performed in the second burst mode is the second write operation at the step S111, the write operation control circuit 203 may perform the step S107. Before the step S107, when performing the first and second write operations in the second burst mode, the data input/output circuit 215 may generate the write data WD from the data DQ received from the outside. The error correction circuit 217 may generate the internal data ID and the parity PA on the basis of the write data WD. At the step S107, the write operation control circuit 203 may generate the write control pulse WT_CTR for storing the internal data ID and the parity PA in the cell arrays 219_1 to 219_I by widening the pulse width of the pre-write control pulse PRE_WT_CTR (see FIG. 4). By this, the second write operation in the second burst mode may be ended.

FIG. 15 is a flowchart for explaining the read operation performed in the memory device 120 illustrated in FIG. 2.

At step S201, the external information input circuit 201 may generate the read command pulse RD and the burst mode signal BL on the basis of the external information CA for the read operation.

At step S203, the read operation control circuit 209 may determine to which one of the first burst mode and the second burst mode the burst mode is set, on the basis of the burst mode signal BL.

When the burst mode is set to the first burst mode at the step S203, the read operation control circuit 209 may perform step S205. At the step S205, the read operation control circuit 209 may generate the read control pulse RD_CTR for outputting the internal data ID and the parity PA stored in the cell arrays 219_1 to 219_I by widening the pulse width of the pre-read control pulse PRE_RD_CTR (see FIG. 8), The error correction circuit 217 may generate the corrected data CD by receiving the internal data ID and the parity PA, At step S207, the data input/output circuit 215 may output the data DQ by receiving the corrected data CD on the basis of the read shift pulse RDS generated by delaying the read command pulse RD. By this, the read operation in the first burst mode may be ended.

When the burst mode is set to the second burst mode at the step S203, the read operation control circuit 209 may perform step S209. At the step S209, the read operation control circuit 209 may determine whether the read operation performed in the second burst mode is the first read operation, on the basis of the burst mode signal BL and the read command pulse RD.

When the read operation performed in the second burst mode is the first read operation at the step S209, the read operation control circuit 209 may sequentially perform the step S205 and the step S207. At the step S205, the read operation control circuit 209 may generate the read control pulse RD_CTR for outputting the internal data ID and the parity PA stored in the cell arrays 219_1 to 219_I by widening the pulse width of the pre-read control pulse PRE_RD_CTR (see FIG. 8). The error correction circuit 217 may generate the corrected data CD by receiving the internal data ID and the parity PA. At step S207, the data input/output circuit 215 may output the data DQ by receiving the corrected data CD on the basis of the read shift pulse RDS generated by delaying the read command pulse RD. By this, the first read operation in the second burst mode may be ended.

When the read operation performed in the second burst mode is the second read operation at the step S209, the read operation control circuit 209 may perform step S211. At the step S211, the read operation control circuit 209 may block the generation of the read control pulse RD_CTR. At the step S207, the data input/output circuit 215 may output the data DQ by receiving the corrected data CD on the basis of the read shift pulse RDS generated by delaying the read command pulse RD. By this, the second read operation in the second burst mode may be ended.

FIG. 16 is a block diagram illustrating a configuration of another example of the electronic system 100 illustrated in FIG. 1. As illustrated in FIG. 16, an electronic system 1000 may include a host (HOST) 1100, a memory controller (MEMORY CONTROLLER) 1200 and memory devices (MEMORY DEVICE) 1300<1:K>. The memory controller 1200 may be implemented by the memory controller 110 illustrated in FIG. 1. Each of the memory devices 1300<1:K> may be implemented by the memory device 120 illustrated in FIG. 1.

The host 1100 and the memory controller 1200 may transmit signals to each other by using an interface protocol. Examples of the interface protocol used between the host 1100 and the memory controller 1200 include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI) and USB (universal serial bus), etc.

The memory controller 1200 may control the memory devices 1300<1:K> such that each of the memory devices 1300<1:K> performs various internal operations including a read operation, a write operation and a burst mode, According to an example, the memory devices 1300<1:K> may be implemented by a DRAM (dynamic random access memory), a PRAM (phase change random access memory), an RRAM (resistive random access memory), an MRAM (magnetic random access memory) and an FRAM (ferroelectric random access memory), etc.

Although some examples of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. A memory device comprising:
an external information input circuit configured to generate a burst mode signal and a write command pulse for a write operation, by receiving external information for the write operation; and
a write operation control circuit configured to generate a write control pulse, for storing internal data in a cell array, from the write command pulse when a first burst mode is performed on the basis of the burst mode signal, and to control whether to generate the write control pulse from the write command pulse when a second burst mode is performed on the basis of the burst mode signal.

2. The memory device according to claim 1, wherein the external information input circuit is configured to generate the burst mode signal for setting a burst mode, by extracting the external information for the write operation, the external information for the write operation includes information on the burst mode, and the burst mode includes the first and second burst modes.

3. The memory device according to claim 1, wherein the external information input circuit is configured to generate the write command pulse and the burst mode signal at each time of receiving the external information for the write operation, and the external information for the write operation in the second burst mode is successively transmitted with a preset interval.

4. The memory device according to claim 1, wherein when performing the write operation in the first burst mode, the write operation control circuit is configured to activate the write control pulse after a period including a write latency elapses from a time point when the write command pulse is input to the write operation control circuit.

5. The memory device according to claim 1, wherein
when performing a first write operation in the second burst mode, the write operation control circuit is configured to block generation of the write control pulse from the write command pulse,
when performing a second write operation in the second burst mode, the write operation control circuit is configured to activate the write control pulse after a period including a write latency elapses from a time point when the write command pulse is input to the write operation control circuit, and
the first and second write operations in the second burst mode are successively performed with a preset interval.

6. The memory device according to claim 1, wherein when performing the write operation in the first burst mode, the write operation control circuit is configured to activate an internal read control pulse for outputting the internal data stored in the cell array, before a period including a write latency elapses from a time point when the write command pulse is input to the write operation control circuit.

7. The memory device according to claim 6, wherein when performing the first and second write operations in the second burst mode, the write operation control circuit is configured to block generation of the internal read control pulse from the write command pulse.

8. The memory device according to claim 1, further comprising:
a write address latch circuit configured to output a column address by latching a write address for the write operation, on the basis of a write strobing pulse,
wherein the write operation control circuit is configured to activate the write strobing pulse on the basis of the write command pulse at each time the write operation is performed.

9. The memory device according to claim 1, wherein the write operation control circuit comprises:
a write shift circuit configured to generate a pre-write control pulse and the write strobing pulse by shifting the write command pulse by a period including a write latency when performing the write operation;
a pipe circuit configured to latch the burst mode signal on the basis of the write command pulse, and output the latched burst mode signal as a write burst mode signal on the basis of the write strobing pulse; and
a write control pulse generation circuit configured to control whether to generate the write control pulse, on the basis of the write burst mode signal when the pre-write control pulse is input to the write control pulse generation circuit.

10. The memory device according to claim 9, wherein the write control pulse generation circuit comprises:
a write masking signal generation circuit configured to deactivate a write masking signal when the pre-write control pulse is input to the write masking signal generation circuit, on the basis of the write burst mode signal for the first burst mode, and activate the write masking signal when the pre-write control pulse is input to the write masking signal generation circuit a preset number of times, on the basis of the write burst mode signal for the second burst mode;
an internal pulse generation circuit configured to control whether to generate an internal pulse from the pre-write control pulse, on the basis of the write masking signal; and
a pulse width adjustment circuit configured to output the write control pulse by widening a pulse width of the internal pulse.

11. The memory device according to claim 1, further comprising:
a data input and output (input/output) circuit configured to receive data having a first burst length when performing the write operation in the first burst mode, and receive data having a second burst length when performing the first and second write operations in the second burst mode,
wherein the second burst length is set to two times the first burst length, and the first and second write operations in the second burst mode are successively performed with the preset interval.

12. A memory device comprising:
an external information input circuit configured to generate a burst mode signal and a read command pulse for a read operation, by receiving external information for the read operation; and
a read operation control circuit configured to generate a read control pulse, for outputting internal data stored in a cell array, from the read command pulse when a first burst mode is performed on the basis of the burst mode signal, and to control whether to generate the read control pulse from the read command pulse when a second burst mode is performed on the basis of the burst mode signal.

13. The memory device according to claim 12, wherein the external information input circuit is configured to generate the burst mode signal for setting a burst mode, by extracting the external information for the read operation, the external information for the read operation includes information on the burst mode, and the burst mode includes the first and second burst modes.

14. The memory device according to claim 12, wherein the external information input circuit is configured to generate the read command pulse and the burst mode signal at each time of receiving the external information for the read operation, and the external information for the read operation in the second burst mode is successively transmitted with a preset interval.

15. The memory device according to claim 12, wherein when performing the read operation in the first burst mode, the read operation control circuit is configured to activate the read control pulse by receiving the read command pulse.

16. The memory device according to claim 12, wherein
when performing a first read operation in the second burst mode, the read operation control circuit is configured to activate the read control pulse by receiving the read command pulse,
when performing a second read operation in the second burst mode, the read operation control circuit is configured to block generation of the read control pulse from the read command pulse, and
the first and second read operations in the second burst mode are successively performed with the preset interval.

17. The memory device according to claim 12, further comprising:
a read address latch circuit configured to output a column address by latching a read address for the read operation, on the basis of a read strobing pulse,
wherein the read operation control circuit is configured to activate the read strobing pulse on the basis of the read command pulse each time the read operation is performed.

18. The memory device according to claim 12, wherein the read operation control circuit comprises:
a read pulse generation circuit configured to generate a pre-read control pulse from the read command pulse when performing the read operation;
a burst mode signal latch circuit configured to output a read burst mode signal by latching the burst mode signal on the basis of the read command pulse; and
a read control pulse generation circuit configured to control whether to generate the read control pulse, on the basis of the read burst mode signal when the pre-read control pulse is input to the read control pulse generation circuit.

19. The memory device according to claim 18, wherein the read control pulse generation circuit comprises:
a read masking signal generation circuit configured to deactivate a read masking signal when the pre-read control pulse is input to the read masking signal generation circuit, on the basis of the read burst mode signal for the first burst mode, and activate the read masking signal when the pre-read control pulse is input to the read masking signal generation circuit a preset number of times, on the basis of the read burst mode signal for the second burst mode;
an internal pulse generation circuit configured to control whether to generate an internal pulse from the pre-read control pulse, on the basis of the read masking signal; and
a pulse width adjustment circuit configured to output the read control pulse by widening a pulse width of the internal pulse.

20. The memory device according to claim 12, further comprising:
a data input and output (input/output) circuit configured to output data having a first burst length when performing the read operation in the first burst mode, and output data having a second burst length when performing the first and second read operations in the second burst mode,
wherein the second burst length is set to two times the first burst length, and the first and second read operations in the second burst mode are successively performed with the preset interval.

* * * * *